United States Patent [19]
Gebhardt et al.

[11] 4,439,022
[45] Mar. 27, 1984

[54] ARRANGEMENT FOR THE POINT- AND LINE-WISE RECORDING OF IMAGE INFORMATION

[75] Inventors: Axel Gebhardt, Mönkeberg; Heinrich Jürgensen, Raisdorf; Christian Roes, Kiel, all of Fed. Rep. of Germany

[73] Assignee: Ing. Rudolf Hell GmbH, Fed. Rep. of Germany

[21] Appl. No.: 296,269
[22] PCT Filed: Dec. 20, 1980
[86] PCT No.: PCT/DE80/00193
§ 371 Date: Aug. 21, 1981
§ 102(e) Date: Aug. 21, 1981
[87] PCT Pub. No.: WO81/01887
PCT Pub. Date: Jul. 9, 1981

[30] Foreign Application Priority Data
Dec. 22, 1979 [DE] Fed. Rep. of Germany ....... 2952209

[51] Int. Cl.³ .................... G02B 5/02; G02B 27/00
[52] U.S. Cl. .................... 350/572; 350/321; 362/32
[58] Field of Search ............... 350/572, 523, 167, 168, 350/321; 362/32, 259

[56] References Cited
U.S. PATENT DOCUMENTS

| | | |
|---|---|---|
| 3,600,568 | 8/1971 | Weyrauch ......................... 350/523 |
| 3,725,574 | 4/1973 | Gast . |
| 3,887,262 | 6/1975 | Blau, Jr. et al. . |
| 3,997,240 | 12/1976 | Kebabian . |
| 4,253,724 | 3/1981 | Minaura et al. . |

FOREIGN PATENT DOCUMENTS

| | | |
|---|---|---|
| 2300968 | 7/1974 | Fed. Rep. of Germany ...... 350/523 |
| 2410079 | 9/1975 | Fed. Rep. of Germany . |
| 2514191 | 10/1975 | Fed. Rep. of Germany . |
| 2803697 | 8/1978 | Fed. Rep. of Germany ...... 350/523 |
| 2719716 | 11/1978 | Fed. Rep. of Germany . |
| 2736319 | 2/1979 | Fed. Rep. of Germany . |
| 2917163 | 11/1979 | Fed. Rep. of Germany . |
| 44-4513 | 2/1969 | Japan ................................. 350/523 |
| 640330 | 12/1978 | U.S.S.R. ............................. 350/572 |

OTHER PUBLICATIONS

Hans–Georg Unger–*Optische Nachrictentechnik*, Elitera–Verhs, Berlin, 1976, pp. 13–31.

*Primary Examiner*—Jon W. Henry
*Attorney, Agent, or Firm*—Hill, Van Santen, Steadman & Simpson

[57] ABSTRACT

The invention relates to a recording arrangement for image information in the production of printing forms. The laser light modulated with the image content is conducted through a multimode light waveguide into a recording element. There, the modulated laser light illuminates a diaphragm which is imaged onto a light-sensitive recording medium as an exposure point. A multimode light waveguide has the disadvantage that the light distribution at its exit surface is non-uniform due to the modes being formed in the light waveguide. Thus, the diaphragm is likewise non-uniformly illuminated and the exposure point exhibits an inhomogeneous light distribution, whereby the exposure on the recording medium is streaky. What is proposed is to dispose a scatter disk (6) and an additional focusing lens (13) between the exit surface (2) of the light waveguide (1) and the diaphragm (17) and to accordingly dimension the optical spacings. Homogenous diaphragm illumination and a streak-free recording are achieved by means of this feature.

9 Claims, 5 Drawing Figures

1

ARRANGEMENT FOR THE POINT- AND LINE-WISE RECORDING OF IMAGE INFORMATION

TECHNICAL FIELD

The invention relates to electronic reproduction technology, particularly to the recording of image information on a light-sensitive recording medium for the production of printing surfaces by means of a ray beam emerging from a light conductor, said ray beam being imaged onto the recording medium through a diaphragm and a lens.

UNDERLYING PRIOR ART

In an electronic reproduction device, a master for gaining an image signal is opto-electronically scanned point- and line-wise. An optical recording element generates a light beam whose luminosity is controlled by the image signal. The light beam exposes a light-sensitive medium (film) point- and line-wise, said medium, for example, being disposed on a rotating recording drum.

A traditional recording element consists, for example, of a stationary, modulatable laser light source whose light is coupled into an optical light conductor (fiber optical waveguide, optical waveguide) in order to conduct it to the recording location. The light emerging from the light conductor illuminates a diaphragm which, with the assistance of a lens, is imaged onto the recording medium as an exposure point. For the purpose of line-wise exposure, the light conductor including the diaphragm and lens are moved axially along the recording drum.

Usually, a multi-mode fiber optical waveguide is employed in such an optical recording element, since, given a monomode waveguide it is very difficult because of its small core diameter to stably couple the light proceeding from a laser light source into a monomode waveguide.

A multimode waveguide, however, has the disadvantage that the light distribution at its exit surface is non-uniform because of the modes forming in the waveguide and additionally changes given a mechanical motion of the waveguide. Thereby, the diaphragm is not uniformly illuminated and the exposure point on the recording medium exhibits a corresponding, inhomogeneous light distribution. As a result, the exposure of the recording medium is also streaky, this having a significantly negative effect on the reproduction quality. A further disadvantage consists therein that the parameters such as exit surface and exit aperture of the waveguide are very difficult to match to the various diaphragm diameters and to the aperture of the lens without light loss.

DISCLOSURE OF THE INVENTION

It is therefore the object of the invention to specify an optical recording element for electronic reproduction devices in which the diaphragm is always homogeneously illuminated in order to produce a streak-free recording and in which only slight light losses occur.

The object is inventively achieved in that a scatter medium (6) for dividing the ray beam (3, 4, 5) into beams with the angle of dispersion ($\beta$) of divergent partial ray beams or secondary ray bundles is disposed between the exit surface (2) of the light waveguide (1) and the diaphragm (17) and a focusing lens (13) is disposed between the scatter medium (6) and the diaphragm (17); in that the spacings ($l_1$, $l_2$) on the optical axis (15) between the exit surface (2) of the light waveguide (1) and the scatter medium (6) as well as between the scatter medium (6) and the focusing lens (13) are dimensioned in such manner that the focusing lens (13) superimposes all secondary ray bundles or partial ray beams (7, 8, 9) in one plane (16) with a spacing ($l_3$) to the focusing lens (13), whereby the diaphragm (17) is disposed around the plane (16) in a superimposition area (18) of the partial ray beams (7, 8, 9); and in that the spacings ($l_4$, $l_5$) between the diaphragm (17), lens (19) and recording medium (20) are dimensioned in such manner that the aperture of the diaphragm is imaged on the recording medium (20) in a desired scale through the lens (19) with the focal length $f_2$.

It is preferably provided that the spacings ($l_2$, $l_3$, $l_4$) between the scatter medium (6), focusing lens (13) and lens (19) are dimensioned in such manner that the image (CD) of the scatter medium (6) is imaged into the lens (19) through the focusing lens (13) with the focal length $f_1$. The diaphragm (17) is preferably disposed in the plane (16).

Advantageously, the size of the superimposition image (AB) of the partial ray beams (7, 8, 9) corresponds to the aperture of the diaphragm (17). An advantageous further development consists therein that a scatter medium (6) for dividing the ray beam (3, 4, 5) into beams with the angles of dispersion ($\delta$) of divergent partial ray beams or secondary ray bundles (7, 8, 9) is disposed between the exit surface (2) of the light waveguide (1) and the diaphragm (17) and a first focusing lens (13) and a second focusing lens (23) are disposed between the scatter medium (6) and the diaphragm (17); in that the spacings ($l_6$, $l_7$) on the optical axis (15) between the exit surface (2) of the light waveguide (1) and the scatter medium (6) as well as between the scatter medium (6) and the first focusing lens (13) are dimensioned in such manner that the first focusing lens (13) intermediately images all partial ray beams (7, 8, 9) as a first superimposition image (AB) in a first plane (16) at a distance ($l_8$) from the first focusing lens (13); in that the spacings ($l_9$, $l_{10}$) between the first plane (16) and the second focusing lens (23) with the focal length $f_3$ are dimensioned in such manner that the second focusing lens (23) images the first superimposition image (AB) as a second superimposition image (A' B') with a first scale in a second plane (24) at a distance ($l_{11}$) from the second focusing lens (23), whereby the diaphragm (17) is disposed in an area around the second plane (24); and in that the spacings ($l_{12}$, $l_{13}$) between the diaphragm (17), lens (19) and recording medium (20) are dimensioned in such manner that the aperture of the diaphragm is imaged on the recording medium (20) with a second scale through the lens (19) with the focal length $f_2$.

It is further proposed that the image (CD) of the scatter medium (6) be intermediately imaged through the first focusing lens (13) into a third plane (22); and that the spacings ($l_{10}$, $l_{11}$, $l_{12}$) between the third plane (22), second focusing lens (23) and lens (19) are dimensioned in such manner that the intermediate image (C'D') of the scatter medium (6) is imaged into the lens (19).

FIG. 4 illustrates the image A"B" to the right of the recording medium 20 upon which an image E"F" is formed.

Preferably, the diaphragm (17) is disposed in the plane (24).

An improvement consists therein that the first scale is selected in such manner that the size of the second superimposition image (A'B') corresponds to the aperture of the diaphragm.

Another further development provides that a scatter medium (6) for dividing the ray beam (3, 4, 5) into beams with the angles of dispersion ($\beta$) of divergent partial ray beams or secondary ray bundles (7, 8, 9) is disposed between the exit surface (2) of the light waveguide (1) and the diaphragm (17) and a first focusing lens (13) and a second focusing lens (23) are disposed between the scatter medium (6) and the diaphragm (17); in that the spacings ($l_{14}$, $l_{15}$, $l_{16}$) on the optical axis (15) are dimensioned between the exit surface (2) of the light waveguide (1) and scatter medium (6), as well as between the scatter medium (6) and the first focusing lens (13) in such manner that the first focusing lens (13) intermediately images all partial ray beams (7, 8, 9) in a first plane (16) as a superimposition image (AB) and intermediately images the image (CD) of the scatter medium (6) as a first intermediate image (C'D') in one plane (27); in that the spacings ($l_{17}$, $l_{18}$, $l_{20}$) are dimensioned in such manner that an image (E'F') of the aperture diaphragm (EF) of the first focusing lens (13) is imaged through the second focusing lens (23) in a first plane (28) and the first intermediate image (C'D') is imaged in the lens (19) as a second intermediate image (C"D"), whereby the diaphragm (17) is disposed in an area around the plane (28); and in that the spacings ($l_{21}$, $l_{22}$) between the plane (28), the lens (19) and the recording medium (20) are dimensioned in such manner that the aperture of the diaphragm is imaged onto the recording medium (20).

BRIEF DESCRIPTION OF THE DRAWINGS

In the following, the invention is described in greater detail on the basis of FIGS. 1 through 4. There are shown.

BEST WAY TO EXECUTE THE INVENTION

Figure 1:
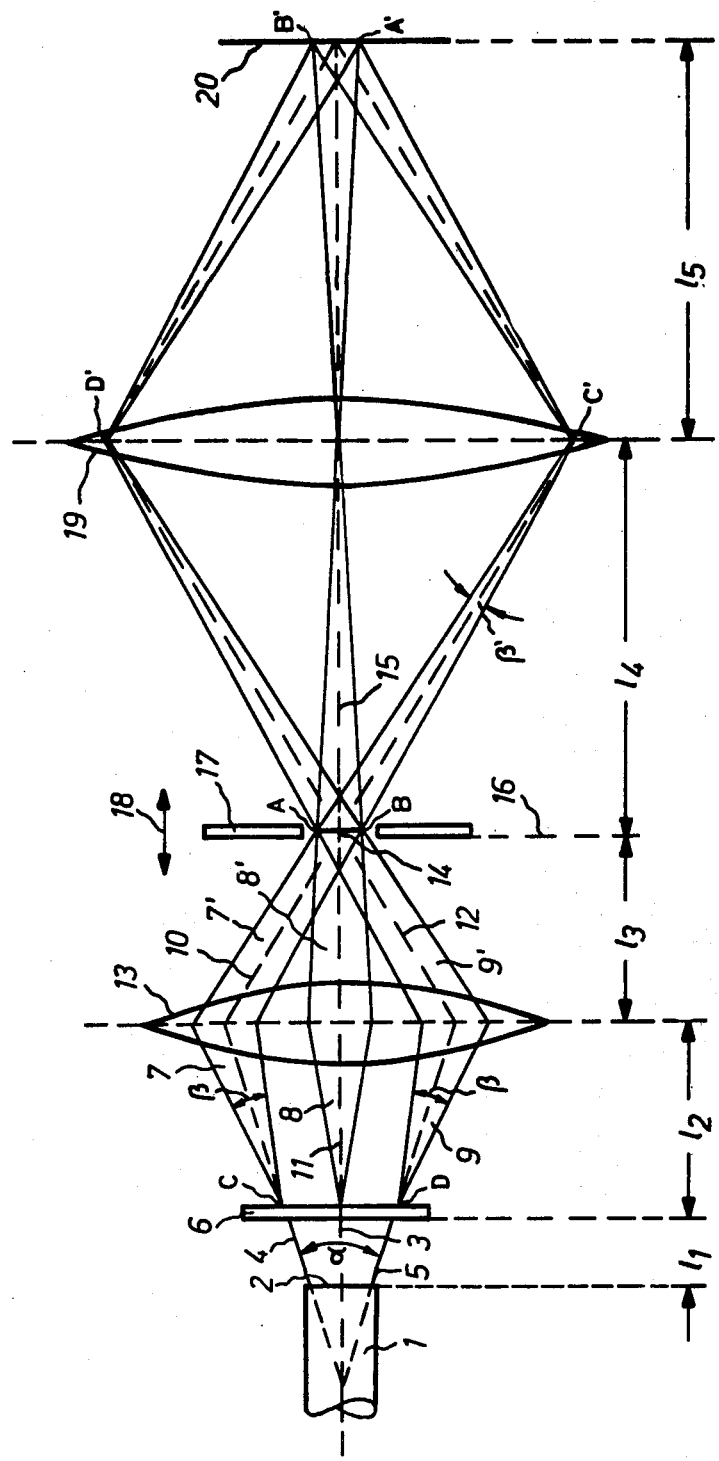
FIG. 1 a sample embodiment of an optical recording element in a sectional figure.

FIG. 1 shows a section through an optical recording element. The light proceeding from a stationary laser light source (not illustrated) is coupled into a light waveguide 1. The light waveguide 1 is of the multimode type and is designed as a stepped index fiber or gradient fiber. The light waveguide 1 can be an individual fiber or a fiber bundle. Such light waveguides are known to one skilled in the art and described, for example, in the book by H.-G. Unger "Optische Nachrichtentechnik", 1976, Elitera-Verlag, Berlin 33.

Due to the modes forming within the light waveguide 1, the light distribution in the exit surface 2 of the light waveguide is non-uniform. One can think of this non-uniform light distribution in such manner that the light beams emerging at various angles within the emergence aperture of the light waveguide 1 exhibit differing intensity and polarization. Of the light beams, only the center beam 3 and the edge beams 4 and 5 are illustrated.

Given traditional recording elements, this non-uniform light distribution would lead to an unsatisfactory diaphragm illumination.

In order to improve the diaphragm illumination, a scattering medium 6 with an angle of dispersion $\beta$, for example, a scatter disk, is disposed at a space $l_1$ from the exit surface 2. The scatter disk 6 fans the modes, illustrated by the beams 3, 4 and 5, into ray beams or bundles 7, 8 and 9 which diverge with the angle of dispersion $\beta$. The center beams 10, 11 and 12 of the ray bundles 7, 8 and 9 are superimposed in a point 14 on the optical axis 15 through a first lens 13 with the focal length $f_1$. The first lens 13 has a distance $l_1 + l_2$ from the exit surface 2 and the point 14 has a distance $l_3$ from the first lens 13. The edge beams of the ray bundles 7', 8' and 9' proceeding from the first lens 13 and converging with the angle $\beta$ intersect at the points A and B which lie in a plane 16 proceeding through the point 14 and perpendicular to the optical axis 15. All ray bundles are superimposed in said plane 16 to form a superimposition image AB.

A diaphragm 17 is disposed in an area 18 which extends to the left and right of the plane 16, but is preferably disposed in the locus of the superimposition image AB in the plane 16. When the diameter of the superimposition image AB coincides with the aperture of the diaphragm 17, then the angle of dispersion $\beta$ is optimally matched to the aperture angle $\beta'$ of the diaphragm 17 so that no light loss occurs at the diaphragm 17. Each convergent bundle of rays 7', 8' and 9' proceeding from the first lens 13 itself fully illuminates the aperture of the diaphragm, whereby the different intensities of the modes or, respectively, of the bundles of rays and the fluctuations of intensity due to a mechanical motion of the light waveguide 1 are compensated in an advantageous manner. The result is a uniform light distribution within the aperture of the diaphragm.

The superimposition image AB is imaged onto a light-sensitive recording medium 20 as the exposure image A'B' with the assistance of a second lens 19 as the lens with the focal length $f_2$, being imaged according to the equation:

$$(1/f_2) = (1/l_4) + (1/l_5) \tag{1}$$

The exposure image A'B' likewise has an homogenous light distribution, so that a streak-free recording ensues in an advantageous manner.

The magnitudes $l_4$, $l_5$ and $f_2$ determine the imaging scale. The size of the exposure image (exposure point) can be matched to the desired recording fineness with the assistance of a zoom lens.

In a further embodiment, the intensity distribution of the modes (scatter image CD) collected at the scatter disk 6 is imaged into the useful diaphragm aperture C'D' of the second lens 19 according to the equation:

$$(1/f_1) = [1/(l_3 l_4)] + (1/l_2) \tag{2}$$

so that all of the light proceeding from the aperture of the diaphragm 17 passes through the lens 19 without light loss.

In praxis, optical arrangements with diaphragm apertures of different size are often employed. In order to avoid light losses, the angle of dispersion $\beta$ of the scatter disk 6 would have to respectively be optimally matched to the aperture angle $\beta'$ of the diaphragm 17. In the arrangement according to FIG. 1, the matching can, for example, ensue within narrow tolerances by means of changing the spacing $l_1$ of the scatter disk 6 from the exit surface 2 of the light waveguide 1 or by means of inserting a scatter disk with a different angle of dispersion $\beta$.

Figure 2:
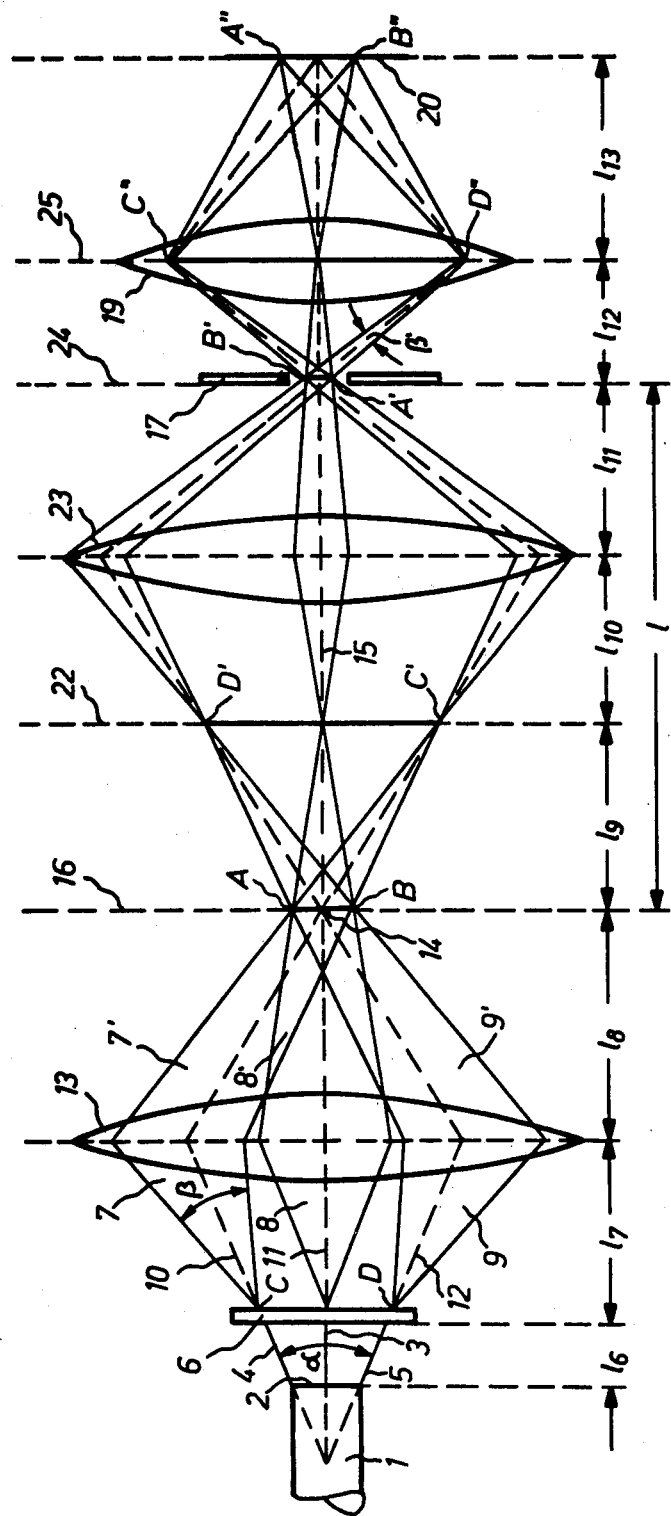
FIG. 2 a further sample embodiment of an optical recording element.

FIG. 2 shows a preferred, further sample embodiment of an optical recording element in which the various parameters, such as diaphragm aperture, diameter and emergence aperture of the light waveguide, as well as standard focal lengths of the lenses employed can be matched to one another with the assistance of intermediate imagings.

The bundles of rays 7', 8' and 9' proceeding from the first lens 13 again generate the superimposition image AB in the plane 16 and, in a parallel plane 22, the image of the scatter disk D'C' as intermediate imagings.

In comparison to FIG. 1, a third lens 23 with the focal length $f_3$ is disposed between the first lens 13 and second lens 19. The third lens 23 images the superimposition image AB in one plane 24 (B'A') and the image of the scatter disk D'C' in a plane 25 (C"D"). The diaphragm 17 is disposed in the plane 24 and the second lens 19 is disposed as the objective in the plane 25.

The imaging scale for the superimposition image B'A' can be changed by the spacings $l_9$, $l_{10}$ and $l_{11}$ as well as by inserting lenses with different focal lengths according to the equation:

$$(1/f_3) = [1/(l_9 + l_{10})] + (1/l_{11}) \tag{3}$$

By so doing, the size of the superimposition image B'A' can be made to coincide with the diaphragm aperture of the diaphragm 17 now to be used, so that all bundles of rays pass through the diaphragm aperture without light loss and the angle of dispersion $\beta$ is optimally matched to the respective aperture angles $\beta'$ of the diaphragms.

When, further, the size of the scatter image C"D" coincides with the usable diaphragm aperture of the lens 19, then the intensities of the light beam are of the same size in front of and behind the lens and this can be advantageously exploited in a control of the light incident upon the recording medium. In this case, namely, the actual value detection can ensue in front of the lens 19, since the small distance between the lens and the recording medium often does not allow the incorporation of a sensor.

Figure 3A:
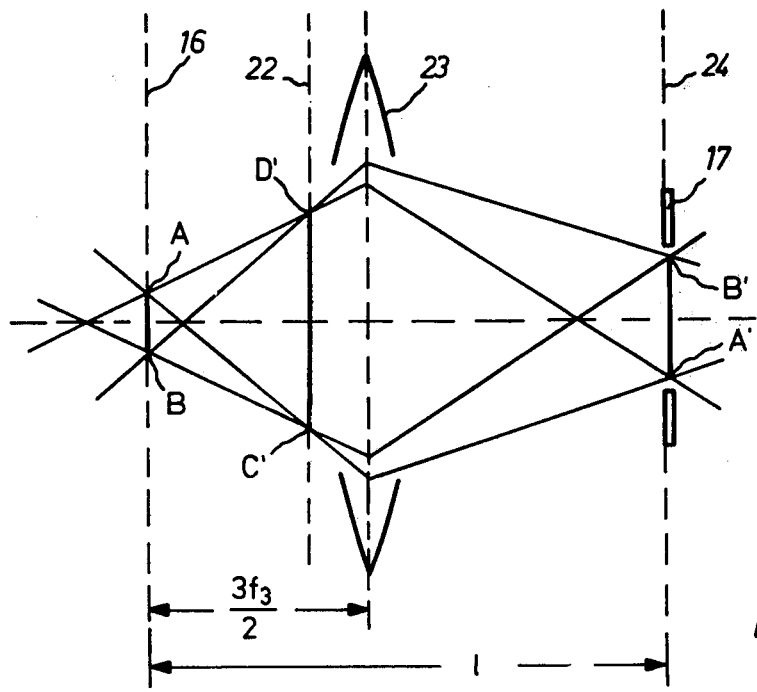
FIG. 3a a first setting variation.
Figure 3B:
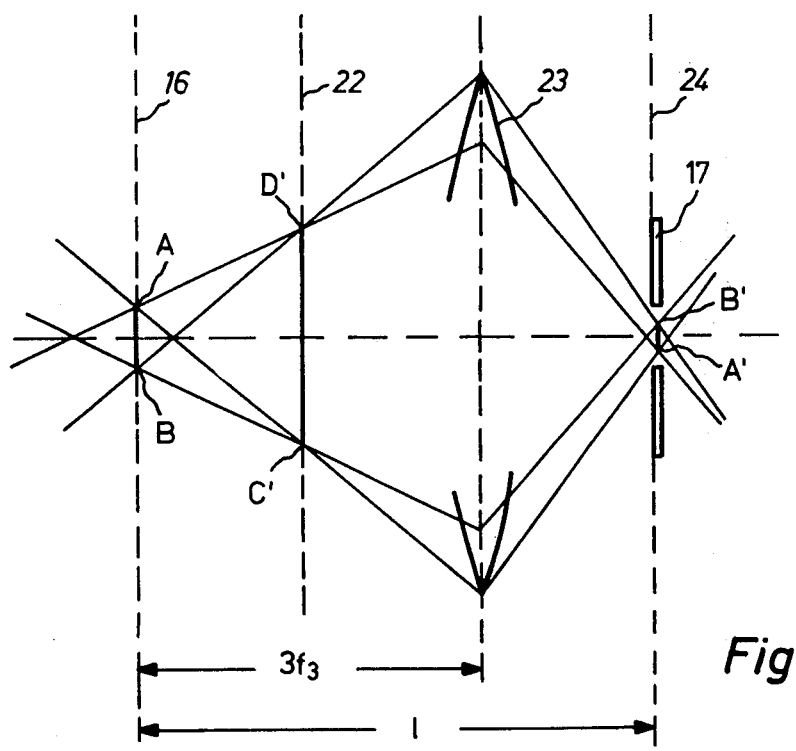
FIG. 3b a second setting variation.

Given a prescribed spacing $L = l_9 + l_{10} + l_{11}$ between the planes 16 and 24 and a prescribed focal length $f_3$ for the lens 23, an imaging scale of "2" and "0.5" can be set by means of displacing the lens 23 in the direction of the optical axis 15, so that, as shown in FIGS. 3a and 3b, two diaphragms 17 with an appropriate ratio of diameters can be fully illuminated.

In FIG. 3a, the lens 23 is disposed at a distance of $3f_3/2$ from the plane 16 and an aperture of the diaphragm 17 is illuminated which is enlarged by the factor "2" in comparison to the superimposition image AB. In FIG. 3b, the lens 23 is situated at a distance $3f_3$ from the plane 16 and a diaphragm aperture which is reduced in comparison to the superimposition image AB by the factor "0.5" is fully illuminated.

Figure 4:
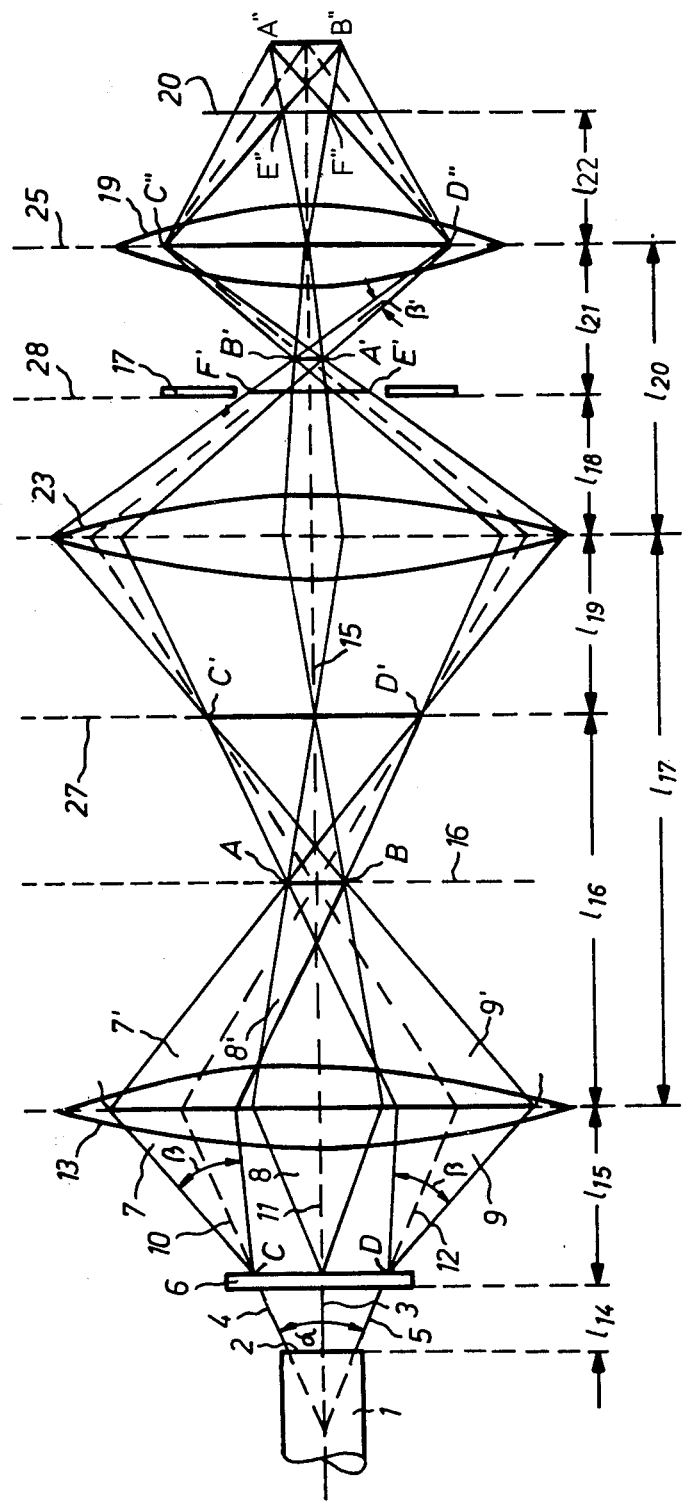
FIG. 4 a different sample embodiment of an optical recording element.

FIG. 4 shows a further sample embodiment of an optical recording element.

With the assistance of the first lens 13 (focal length $f_1$), a first intermediate image D'C' of the image CD of the scatter disk (6) is generated in a plane 27 according to the equation:

$$(1/f_1) = (1/l_{15}) + (1/l_{16}) \tag{4}$$

The third lens 23 (focal length $f_3$) images the aperture diaphragm EF of the lens 13 in a plane 28 as an intermediate image F'E' according to the equation:

$$(1/f_3) = (1/l_{17}) + (1/l_{18}) \tag{5}$$

The diaphragm 17 is disposed in the plane 28. The imaging scale for the image EF of the diaphragm aperture is selected in such manner that the intermediate image F'E' again fully illuminates the aperture of the diaphragm 17.

At the same time, the lens 23 (focal length $f_3$) images the intermediate image C'D' of the scatter disk 6 in the diaphragm aperture of the lens 19 (objective) according to the equation:

$$(1/f_3) = (1/l_{19}) + (1/l_{20}) \tag{6}$$

The lens 19 images the aperture E'F' of the diaphragm 17 on the recording medium 20 as the diaphragm image E"F" according to the equation:

$$(1/f_2) = (1/l_{21}) + (1/l_{22}) \tag{7}$$

Commercial Utilization

The invention is advantageously employed in the entire field of reproduction technology given scanning and recording by means of light transmission via light waveguides. However, the invention can also be used everywhere where homogenous illumination is a concern given light waveguide transmission.

We claim:

1. In an arrangement for point and line-wise recording of image information on a light sensitive recording medium by means of a group of rays emerging from a light waveguide and being imaged through a diaphragm and a first lens onto the recording medium, the improvements comprising a scatter medium for dividing each ray of the group of rays into a ray bundle diverging with an angle of dispersion ($\beta$) being disposed between an exit surface of the light waveguide and the diaphragm, a focusing lens being disposed between the scatter medium and the diaphragm, the spacing ($l_1$) on the optical axis between the exit surface of the light waveguide and the scatter medium and the spacing ($l_2$) between the scatter medium and the focusing lens being dimensioned in such manner that the focusing lens superimposes all ray bundles to form superimposed fields (AB) in a plane at a distance ($l_3$) from the focusing lens, said diaphragm being disposed in the superimposition area of the ray bundles and around the plane, and wherein the spacings ($l_4$) between the diaphragm and the first lens and the spacing ($l_5$) between the first lens and the recording medium being dimensioned in such a manner that the diaphragm aperture at the superimposed fields is imaged in a desired scale on the recording medium through the first lens with a focal length $f_2$.

2. In an arrangement according to claim 1, wherein the spacings ($l_2$, $l_3$, $l_4$) between the scatter medium, focusing lens and first lens are dimensioned in such manner that an image (CD) of the scatter medium is formed on the first lens through the focusing lens which has a focal length $f_1$.

3. In an arrangement according to claim 1, wherein the diaphragm is disposed in said plane.

4. In an arrangement according to claim 1, wherein the size of the image (AB) of the ray bundles in said plane corresponds to the aperture of the diaphragm.

5. In an arrangement for point and line-wise recording of the image information on a light-sensitive recording medium by means of a group of rays emerging from a light waveguide and being imaged onto the recording medium through a diaphragm and a first lens, the improvement comprising a scatter medium for dividing each ray of the group of rays into a ray bundle diverging with an angle of dispersion ($\beta$) being disposed between an exit surface of the light waveguide and the diaphragm, a first focusing lens and a second focusing lens being disposed between the scatter medium and the diaphragm, the spacing ($l_6$) on the optical axis between the exit surface of the light waveguide and the scatter medium and the spacing ($l_7$) between the scatter medium and the first focusing lens being dimensioned in such a manner that the first focusing lens intermediately forms all ray bundles as superimposed fields (AB) in a first plane between the first and second focusing lens and at a distance ($l_8$) from the focusing lens, the spacings ($l_9+l_{10}$) between the first plane and the second focusing lens with a focal length $f_3$ being dimensioned in such manner that the second focusing lens images the superimposed fields (AB) as a second superimposed image (A'B') with a first scale in a second plane at a distance ($l_{11}$) from the second focusing lens, said diaphragm being disposed in an area around the second plane; and the spacing ($l_{12}$) between the diaphragm and the first lens and the spacing ($l_{13}$) between the first lens and recording medium being dimensioned in such manner that the diaphragm aperture is imaged onto the recording medium with a second scale through the first lens with a focal length $f_2$.

6. In an arrangement according to claim 5, wherein an image (CD) of the scatter medium is intermediately formed on the first focusing lens into a third plane and wherein the spacing ($l_{10}$) between the third plane and the second focusing lens, and the spacing ($l_{11}+l_{12}$) between the second focusing lens and the first lens are dimensioned in such manner that an intermediate image (C'D') of the scatter medium is formed on the first lens.

7. In an arrangement according to claim 5, wherein the diaphragm is disposed in the second plane.

8. In an arrangement according to claim 5, wherein the first scale is selected in such manner that the size of the second superimposed fields (A'B') corresponds to the diaphragm aperture.

9. In an arrangement for point and line-wise recording of image information on a light-sensitive recording medium by means of a group of rays emerging from a light waveguide and being imaged on the recording medium through a diaphragm and a first lens, the improvement comprising a scatter medium for the division of each ray of the group of rays into a ray bundle diverging with an angle of dispersion ($\beta$) being disposed between an exit surface of the light waveguide and the diaphragm, a first focusing lens and a second focusing lens being disposed between the scatter medium and the diaphragm, the spacing ($l_{14}$) on the optical axis between the exit surface of the light waveguide and the scatter medium and the spacing ($l_{15}$) between the scatter medium and the first focusing lens being determined in such a manner that the first focusing lens intermediately form all ray bundles as superimposed fields (AB) in a first plane and intermediately images the image of the scatter medium as a first intermediate image (C'D') in a second plane at a distance ($l_{16}$) from the first focusing lens between the first and second focusing lens, a spacing ($l_{17}$) between the first and second focusing lens, a spacing ($l_{18}$) between the second focusing lens and a third plane and the spacing ($l_{20}$) between the second focusing lens and the first lens being dimensioned in such manner that an image (E'F') of the diaphragm aperture (EF) of the first focusing lens is formed in the third plane through the second focusing lens and the superposed fields (C'D') is formed as a superposed field (C"C") in the first lens after passing through the second focusing lens, said diaphragm being disposed in an area around the third plane, and the spacing ($l_{21}$) between the third plane and the first lens and the spacing ($l_{22}$) between the first lens and the recording medium being dimensioned in such manner that the diaphragm aperture is imaged onto the recording medium.

* * * * *